(12) United States Patent
Yu et al.

(10) Patent No.: US 10,192,761 B2
(45) Date of Patent: Jan. 29, 2019

(54) PICK ARM COMPRISING A WINGED PART FOR A BONDING APPARATUS

(71) Applicant: ASM Technology Singapore Pte Ltd, Singapore (SG)

(72) Inventors: Kin Fung Yu, Hong Kong (HK); Yu Xing Cao, Hong Kong (HK); Wing Chiu Lai, Hong Kong (HK); Kai Siu Lam, Hong Kong (HK); Gary Peter Widdowson, Hong Kong (HK); Ying Zhuo Liu, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 15/428,289

(22) Filed: Feb. 9, 2017

(65) Prior Publication Data

US 2017/0238449 A1 Aug. 17, 2017

Related U.S. Application Data

(60) Provisional application No. 62/295,397, filed on Feb. 15, 2016.

(51) Int. Cl.
*H01L 21/67* (2006.01)

(52) U.S. Cl.
CPC .............. *H01L 21/67144* (2013.01)

(58) Field of Classification Search
None
See application file for complete search history.

(56) References Cited

U.S. PATENT DOCUMENTS

| 2003/0013322 | A1* | 1/2003 | Choy | B65G 47/904 |
| | | | | 438/800 |
| 2008/0247857 | A1* | 10/2008 | Yuasa | B25J 9/0012 |
| | | | | 414/680 |
| 2009/0169346 | A1* | 7/2009 | Hamono | H01L 21/68707 |
| | | | | 414/225.01 |

* cited by examiner

*Primary Examiner* — Gerald McClain
(74) *Attorney, Agent, or Firm* — Ostrolenk Faber LLP (57) ABSTRACT

A pick arm for a pick and place apparatus for semiconductor devices, the pick arm comprising first and second ends along a longitudinal axis of the pick arm, and a pick tool located at the first end of the pick arm for picking up semiconductor devices. The pick arm further comprises a winged part extending in a direction transverse to the longitudinal axis between the first and second ends of the pick arm, wherein the winged part comprising a sloping surface. The sloping surface is inclined between a top portion and a bottom portion of the winged part such that the sloping surface is nearer to the longitudinal axis at the top portion than at the bottom portion of the winged part.

13 Claims, 6 Drawing Sheets

PICK ARM COMPRISING A WINGED PART FOR A BONDING APPARATUS

FIELD OF THE INVENTION

The invention relates to a pick arm for a bonding apparatus, and in particular to such a pick arm for use in a semiconductor die attachment process. More specifically, the invention is especially applicable to a pick and place apparatus that is operated at high speed.

BACKGROUND

A pick and place apparatus is used to pick up an object from a first location and thereafter to place the object in a second location. Pick and place apparatus are typically used in various semiconductor manufacturing processes, such as die bonding and die sorting.

After a semiconductor wafer has been fabricated, the semiconductor wafer is usually mounted onto an adhesive film such as Mylar film. The semiconductor wafer is subsequently singulated into individual semiconductor dice. Then, a pick and place apparatus may be used to pick a die from the adhesive film, and transfer the die to a desired location.

The speed of a pick and place operation, for example a die attachment operation, is partly dependent on the speed with which the pick and place apparatus can function to accurately pick a die and place the die in the desired location. However, as die sizes continue to shrink, greater accuracy is required during pick and place operations. As a result, the competing needs for speed and accuracy pose challenges for pick and place apparatus.

Figure 1:
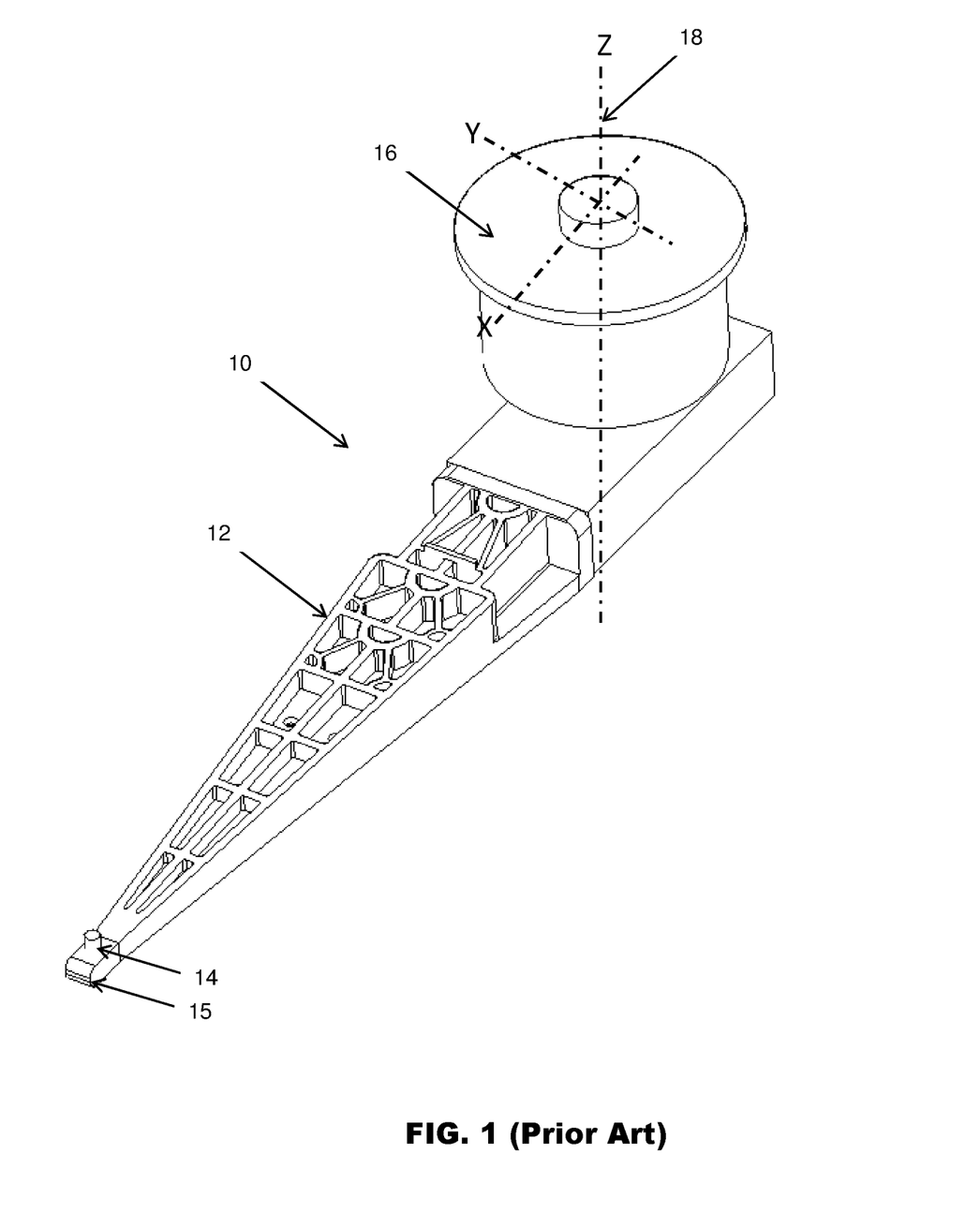
FIG. 1 is a perspective view of a pick arm for a pick and place apparatus according to the prior art.

FIG. 1 is a perspective view of a pick arm 12 for a pick and place apparatus 10 according to the prior art. The pick and place apparatus 10 comprises the pick arm 12 rotatable about a rotary axis 18 of an actuator 16. A pick tool 14 is located near a distal end 15 of the pick arm 12. The pick arm 12 rotates to a pick-up location, where singulated dice adhering to an adhesive film are positioned below the pick tool 14 and the pick arm 12. A die to be picked up is positioned below the pick tool 14. The pick arm 12 moves downwards along the Z axis, for the pick tool 14 to pick up the die. After picking up the die, the pick arm 12 moves upwards along the Z axis, and then rotates along a transfer plane to a placement location. The desired location to place the die is positioned below the pick tool 14 and the pick arm 12 at the placement location.

In high speed pick and place operations, the pick arm 12 is rotated about the rotary axis 18 at high speeds, and is stopped at the pick-up location or the placement location rapidly. These rapid movements of the pick arm 12 create air turbulence and/or air pressure differences in the air above the adhesive film, thus causing the adhesive film, at the pick-up location or the placement location, to vibrate uncontrollably. The adhesive film may vibrate to such an extent that the dice on the adhesive film hit the pick tool 14, which may damage the dice. Moreover, even if the dice do not hit the pick tool 14, the pick tool 14 cannot proceed to pick or place the die until the adhesive film stops its vibration. This slows down the pick and place operations, and therefore reduces throughput.

SUMMARY OF THE INVENTION

It is thus an object of this invention to seek to provide an apparatus for picking and placing semiconductor dice which provides a higher level of accuracy and/or operates faster compared to the prior art.

According to a first aspect of the invention, there is provided a pick arm for a pick and place apparatus for semiconductor devices, the pick arm comprising: first and second ends along a longitudinal axis of the pick arm; a pick tool located at the first end of the pick arm for picking up semiconductor devices; and a winged part extending in a direction transverse to the longitudinal axis between the first and second ends of the pick arm, the winged part comprising a sloping surface; wherein the sloping surface is inclined between a top portion and a bottom portion of the winged part such that the sloping surface is nearer to the longitudinal axis at the top portion than at the bottom portion of the winged part.

According to a second aspect of the invention, there is provided a pick and place apparatus for semiconductor devices, the apparatus including: a pick arm comprising: first and second ends along a longitudinal axis of the pick arm; a pick tool located at the first end of the pick arm for picking up semiconductor devices; and a winged part extending in a direction transverse to the longitudinal axis between the first and second ends of the pick arm, the winged part comprising a sloping surface; wherein the sloping surface is inclined between a top portion and a bottom portion of the winged part such that the at least one sloping surface is nearer to the longitudinal axis at the top portion than at the bottom portion of the winged part.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION

In the summary, the following description, and the appended claims, the term "incline" does not require flatness. The inclined surfaces may for example be curved, uneven, or jagged, just as the steps of a stair can be said to incline at an angle without being flat.

Figure 2:
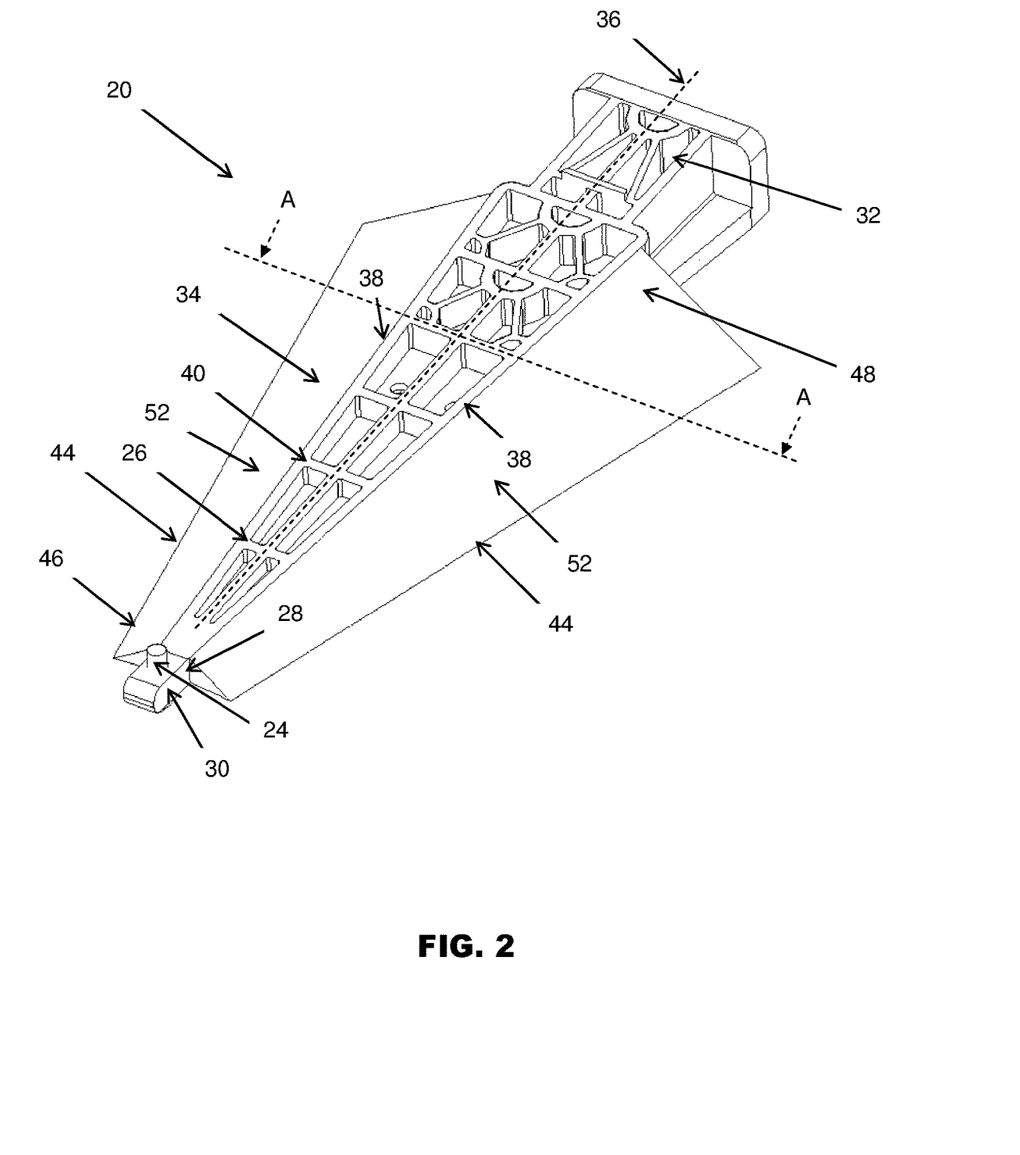
FIG. 2 is a perspective view of a pick arm according to a first preferred embodiment of the present invention.

FIG. 2 is a perspective view of a pick arm 20 according to a first preferred embodiment of the present invention for picking semiconductor dice from a pick-up location and placing the semiconductor dice at a placement location. The pick arm 20 (or pick and place arm) incorporates a pick tool 24 located at a distal end 30 of the pick arm 20. A proximal end 32 (or rear portion) of the pick arm 20 is attached to an actuator (not shown). The pick arm 20 extends radially from the actuator, and is rotatable about a vertical rotary axis of the actuator proximate the proximal end 32 of the pick arm 20. A plane of rotation of the pick arm 20 is configured to be substantially horizontal or parallel to a surface of an adhesive film on which semiconductor dice are mounted.

The pick arm 20 comprises a central segment 26 and two winged parts 34 between the distal end 30 and the proximal end 32 of the pick arm 20. Each winged part 34 is located at a respective opposing side of the central segment 26. The winged parts 34 extend substantially alongside a longitudinal axis 36 of the pick arm 20 and in a transverse direction to the longitudinal axis 36. A front portion 46 of each winged part 34 is adjacent the distal end 30 of the pick arm 20, and a tail portion 48 of each winged part 34 is adjacent the proximal end 32 of the pick arm 20. Each winged part 34 comprises a sloping surface 52 located alongside a respective side of the pick arm 20. The central segment 26 is located in-between the two sloping surfaces 52, where a respective sloping surface 52 is located alongside and slopes away from each of the two opposing sides of the central segment 26. The pick arm 20 may comprise at least one cavity in the central segment 26. The advantage of the at least one cavity is to reduce a weight of the pick arm 20.

The central segment 26 comprises a top surface 40 extending between the distal end 30 and the proximal end 32 of the pick arm 20. Each of the two sloping surfaces 52 meets the top surface 40 along a respective edge 38 of the top surface 40. The edges 38 converge from the proximal end 32 towards the distal end 30 of the pick arm 20, thus the top surface 40 has a substantially trapezoidal shape.

Each of the two sloping surfaces 52 slopes downwards from the respective edge 38, until each of the two sloping surfaces 52 meets a bottom surface (42, see FIG. 5) of the respective winged part 34 along a bottom edge 44 at the bottom surface 42. The sloping surfaces 52 extend between a top portion of the winged part 34 and a bottom portion of the winged part 34, such that a width of the top portion of the winged part 34 in the transverse direction to the longitudinal axis 36 is narrower than a width of the bottom portion of the winged part 34 in the transverse direction to the longitudinal axis 36. In other words, the sloping surfaces 52 are nearer to the longitudinal axis 36 at the top portion of the winged parts 34 than at the bottom portion of the winged parts 34. The pick arm 20 may be formed by having two separate winged parts 34 mounted onto two opposing side walls 28 of the central segment 26. The pick arm 20 may also be formed as an integrated single piece comprising the winged parts 34 adjoining the opposing side walls 28 of the central segment 26.

Figure 3:
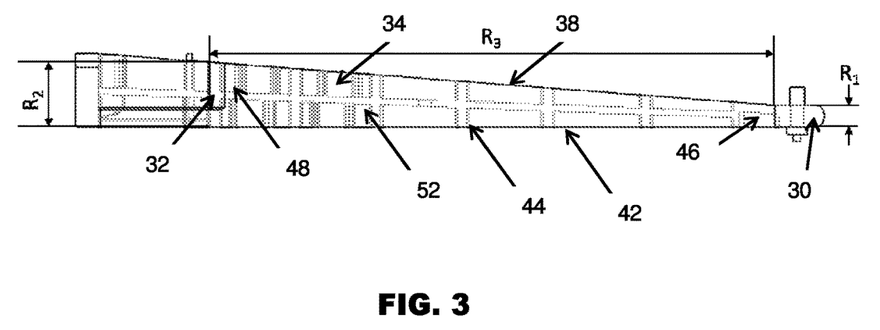
FIG. 3 is a side view of the pick arm of FIG. 2.

FIG. 3 is a side view of the pick arm 20 of FIG. 2. Similarly, the sloping surface 52 slopes downwards from the edge 38 of the top surface 40 to the bottom edge 44 at the bottom surface 42. The tail portion 48 of the winged part 34 is adjacent to the proximal end 32 of the pick arm 20, and the front portion 46 of the winged part 34 is adjacent to the distal end 30 of the pick arm 20. The edge 38 of the top surface 40 inclines downwards from the tail portion 48 to the front portion 46. The bottom edge 44 of the bottom surface 42 is oriented to be substantially horizontal or parallel to the adhesive film surface. The distal end 30 of the pick arm 20 has a front height R1, and the proximal end 32 has a rear height R2. The winged part 34 and the proximal end 32 of the pick arm 20 have a length R3. The front height R1, the rear height R2, and the length R3 may be used to define the dimensions of the sloping surfaces 52 of the winged part 34.

Figure 4:
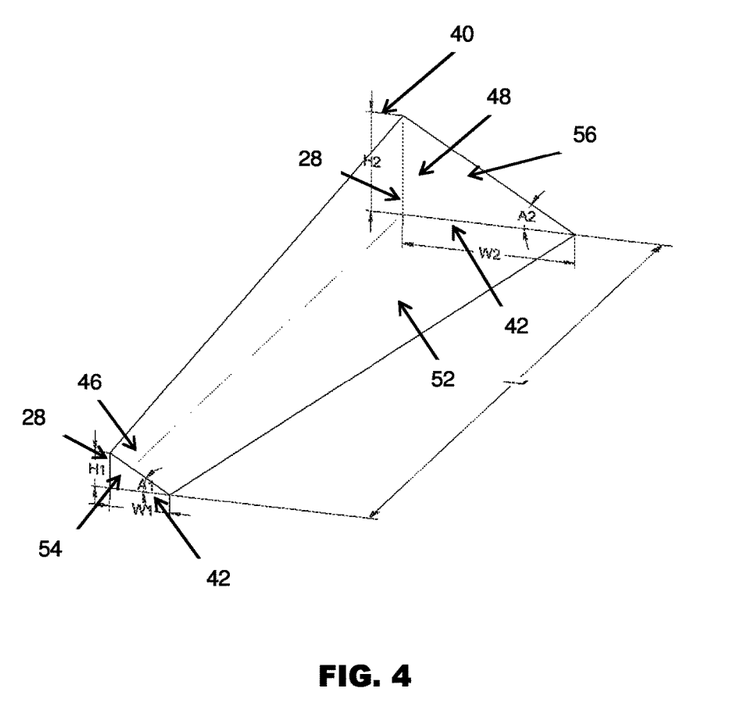
FIG. 4 is a perspective view of a sloping surface of a winged part of the pick arm of FIG. 2.

FIG. 4 is a perspective view of the sloping surface 52 of the winged part 34 of the pick arm 20 of FIG. 2. The winged part 34 comprises a front portion cross-section 54 at the front portion 46, and a tail portion cross-section 56 at the tail portion 48. The front portion cross-section 54 and the tail portion cross-section 56 are generally perpendicular to the longitudinal axis 36. The front portion cross-section 54 comprises a right-angle triangle. The sloping surface 52 forms the hypotenuse of the triangle, and the bottom surface 42 and the side wall 28 form the two sides enclosing the right angle of the triangle. The sloping surface 52 of the front portion cross-section 54 forms an acute angle A1 with the bottom surface 42. The angle A1 may vary but preferably falls between 10° and 60°. The sloping surface 52 may be inclined at an obtuse angle, preferably falling between 120° and 170°, to the top surface 40 of the central segment 26. The bottom surface 42 of the front portion cross-section 54 has a width W1, which may vary but preferably falls between 0.5R1 and 6R1. The side of the front portion cross-section 54 opposite the acute angle A1 has a height H1, which may be approximately R1.

The tail portion cross-section 56 of the winged part 34 comprises another right-angle triangle. The sloping surface 52 forms the hypotenuse of the triangle, and the bottom surface 42 and the side wall 28 form the two sides enclosing the right angle of the triangle. The sloping surface 52 of the tail portion cross-section 56 forms an acute angle A2 with the bottom surface 42. The angle A2 may vary but preferably falls between 10° and 60°. The sloping surface 52 may be inclined at an obtuse angle, preferably falling between 120° and 170°, to the top surface 40 of the central segment 26. The bottom surface 42 of the tail portion cross-section 56 has a width W2, which may vary but preferably falls between 0.5R1 and 6R1. The side of the tail portion cross-section 56 opposite the acute angle A2 has a height H2, which may be approximately R2. The length L of the winged part 34 may vary but preferably falls between 0.1R3 and R3.

Figure 5:
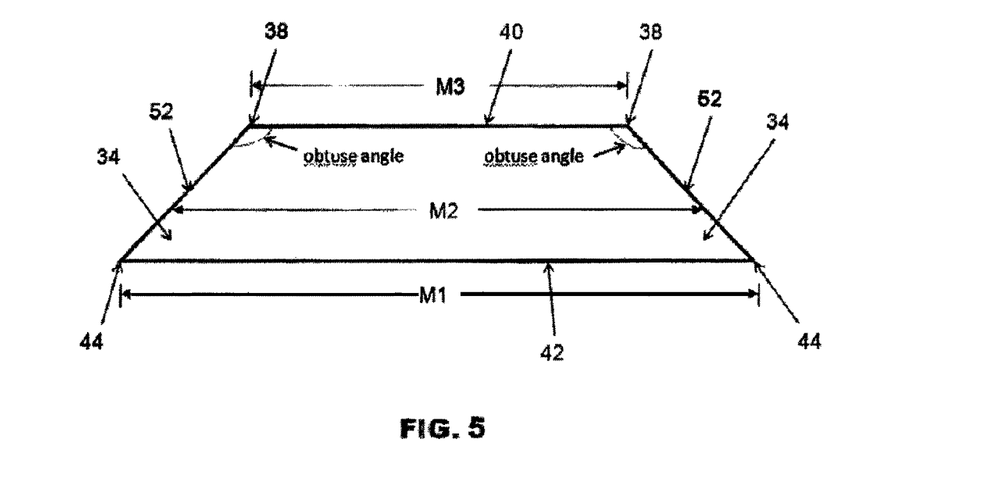
FIG. 5 is a cross-sectional view of the pick arm looking along the line A-A of FIG. 2.

FIG. 5 is a cross-sectional view of the pick arm 20 along the line A-A of FIG. 2. The cross-section of the pick arm 20 is taken perpendicular to the longitudinal axis 36. Each of the two edges 38 of the top surface 40 adjoins a respective sloping surface 52 of the winged part 34. Each of the two sloping surfaces 52 meets the bottom surface 42 at a respective bottom edge 44. The surfaces 40, 42, 52 may all be planar, such that the cross-section of the pick arm 20 including the winged part 34 forms a trapezoidal shape. However, one or more of the surfaces 40, 42, 52 may not be planar, for example at least one of the surfaces 30, 42, 52 may be curved or uneven. The cross-section may have other shapes, for example triangular, in which case the top surface 40 would form an edge.

The width M1 of the bottom surface 42 of the pick arm 20, the width M3 between the edges 38 adjacent to the top surface 40, and the width M2 at a position intermediate the top surface 40 and the bottom surface 42, are measured perpendicular to the longitudinal axis 36 and generally horizontal or parallel to the plane of rotation of the pick arm 20. The length M1 is longer than the length M2, which in turn is longer than the length M3. Hence, the cross-section of the winged part 34 tapers from the bottom surface 42 towards the top surface 40.

Figure 6:
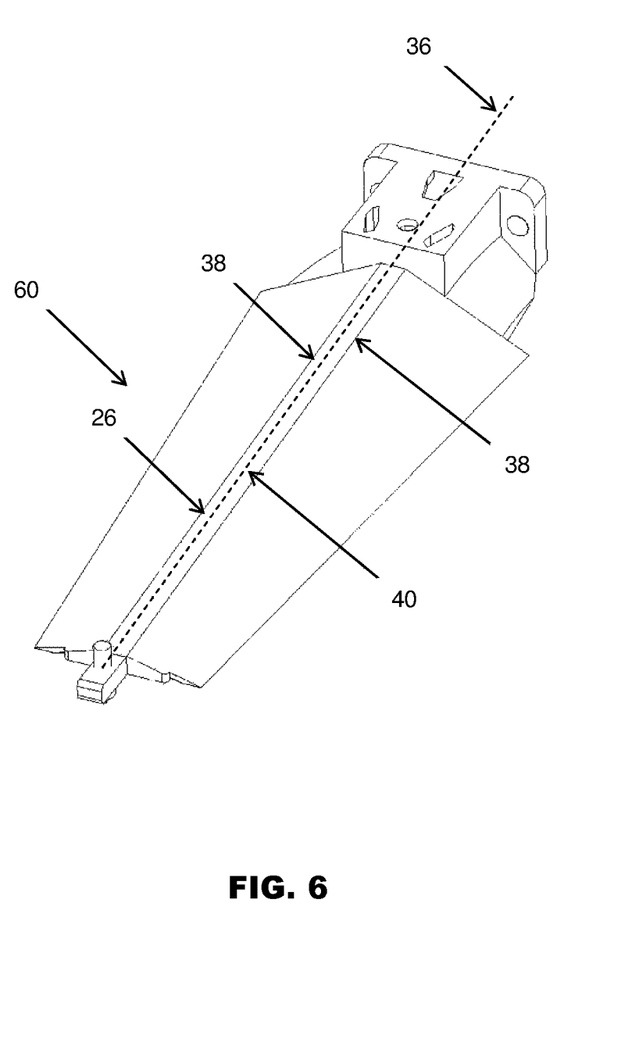
FIG. 6 is a perspective view of a pick arm according to a second preferred embodiment of the present invention.

FIG. 6 is a perspective view of a pick arm 60 according to a second preferred embodiment of the present invention. The pick arm 60 is similar to the pick arm 20 according to the first preferred embodiment of the present invention. The pick arm 60 comprises a central segment 26, where a top surface 40 of the central segment 26 comprises substantially parallel edges 38 running substantially parallel to a longitudinal axis 36 of the pick arm 60. Hence the top surface 40 forms a substantially rectangular shape.

Figure 7:
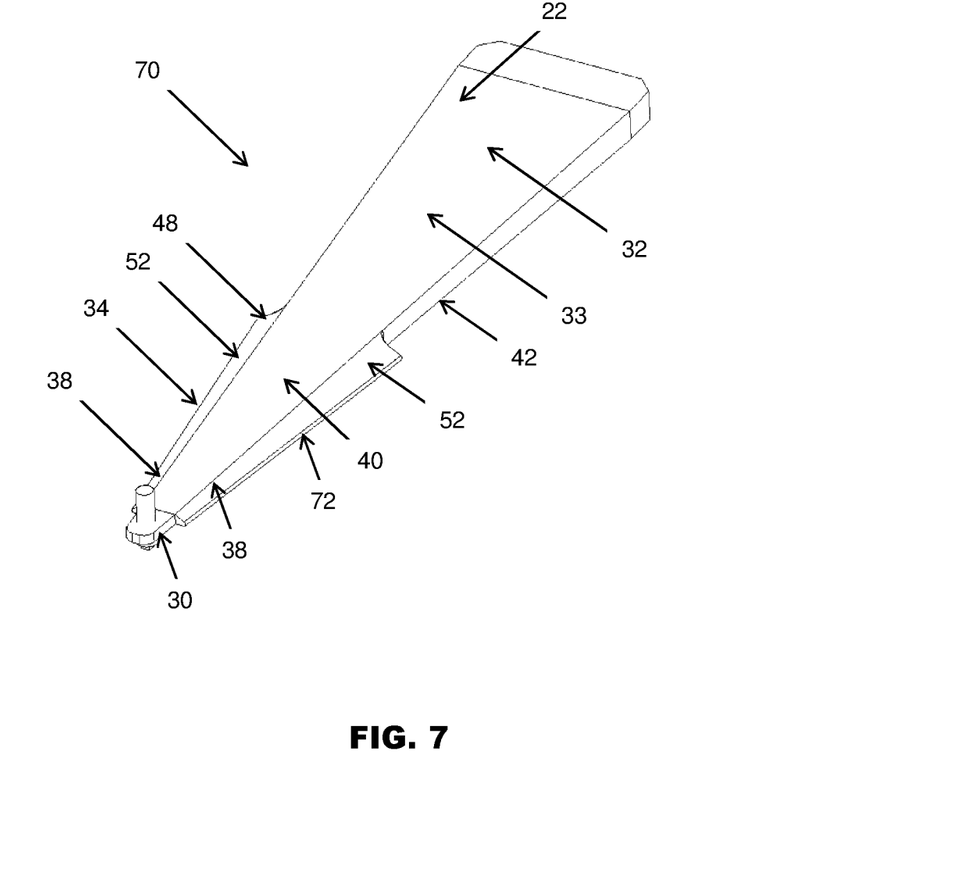
FIG. 7 is a perspective view of a pick arm according to a third preferred embodiment of the present invention.

FIG. 7 is a perspective view of a pick arm 70 according to a third preferred embodiment of the present invention. The pick arm 70 is similar to the pick arm 20 according to the first preferred embodiment. The pick arm 70 comprises a substantially triangular-shaped pick arm 70 (viewed from the top), where a substantially trapezoidal-shaped top surface 40 of the pick arm 70 is coplanar with a top surface of a proximal end 32 of the pick arm 70. Two winged parts 34 are confined to an area next to a distal end 30 of the pick arm 70. An intermediate portion 33 of the pick arm 70 is located intermediate the winged parts 34 and the proximal end 32 of the pick arm 70. Hence tail portions 48 of the winged parts 34 are adjacent the intermediate portion 33, and the winged parts 34 are remote from an actuator (not shown) connected to the proximal end 32 of the pick arm 70. In other words, the winged parts 34 are nearer to the distal end 30 of the pick arm 70 than the proximal end 32 of the pick arm 70. Each of the two winged parts 34 comprises a respective sloping surface 52. The sloping surfaces 52 slope downwards from the top surface 40 until each of the sloping surfaces 52 meets a respective winged part side wall 72. The winged part side walls 72 are substantially perpendicular to a bottom surface 42 (and/or the top surface 40) of the pick arm 70. Instead of the winged part sidewalls 72 being perpendicular to the bottom surface 42, the winged part side walls 72 may incline at oblique angles with respect to the bottom surface 42. Hence, the winged parts 34 slope down from edges 38 towards the winged part side walls 72 which rise from the bottom surface 42.

In operation, the pick arm 20, 60, 70 rotates at a high speed between the pick-up location and the placement location. During the movement of the pick arm 20, 60, 70, the sloping surfaces 52 help to reduce the magnitude of the pressure differential in the layer of air in front of the pick arm 20, 60, 70 in the direction of movement of the pick arm 20, 60, 70, and in the layer of air behind the pick arm 20, 60, 70 in the direction of movement of the pick arm 20, 60, 70. There is also less air turbulence created. As a result, the vibrations of the adhesive film caused by air turbulence and/or air pressure differences are significantly reduced. Hence, the idle time of the pick arm 20, 60, 70 while waiting for the vibrations to stop before the pick arm 20, 60, 70 picks up a die is reduced or avoided. Therefore, the pick arm 20, 60, 70 may operate accurately even when operating at a high speed.

Although the present invention has been described in considerable detail with reference to certain embodiments, other embodiments are possible.

For example, instead of the pick arm 20, 60, 70 comprising three pieces (the central segment 26 and the two winged parts 34), the pick arm 20, 60, 70 comprising the central segment 26 and the two winged parts 34 may just comprise one single integrated piece. Instead of the cross-section of the pick arm 20, 60, 70 comprising a trapezoidal shape, it may also comprise other shapes which do not affect its function such as a parallelogram.

Instead of the surfaces 40, 42, 52 being planar, the surfaces 40, 42, 52 or portions thereof may also be ribbed, convex, or concave. Instead of having two sloping surfaces 52 or winged parts 34 on two opposite sides of the central segment 26, the pick arm 20, 60, 70 may comprise only one sloping surface 52 or winged part 34 on one side of the pick arm 20, 60, 70.

Therefore, the spirit and scope of the appended claims should not be limited to the description of the embodiments contained herein.

The invention claimed is:

1. A pick arm for a pick and place apparatus for semiconductor devices, the pick arm comprising:
    first and second ends along a longitudinal axis of the pick arm;
    a pick tool located at the first end of the pick arm and configured for picking up semiconductor devices located below a bottom surface of the pick arm;
    a central segment separate from the pick tool and extending between the pick tool and the second end of the pick arm; and
    a winged part adjacent the central segment and extending in a direction transverse to the longitudinal axis between the pick tool and the second end of the pick arm,
    wherein the winged part comprises a sloping surface;
    wherein the sloping surface is inclined between a top portion of the winged part corresponding to a height of a top surface of the central segment and a bottom portion of the winged part corresponding to a height of a bottom surface of the central segment, such that the sloping surface is nearer to the longitudinal axis at the top portion titan at the bottom portion of the winged part.

2. The pick arm of claim 1, wherein the winged part is a separate piece mountable onto the central segment of the pick arm.

3. The pick arm of claim 1, further comprising another winged part comprising another sloping surface,
    wherein each of the two sloping surfaces is located at a respective opposing side of the central segment of the pick arm.

4. The pick arm of claim 3, wherein the pick arm comprises a trapezoidal cross-section perpendicular to the longitudinal axis of the pick arm.

5. The pick arm of claim 1, wherein the sloping surface is inclined at an acute angle to a bottom surface of the pick arm.

6. The pick arm of claim 5, wherein the sloping surface is inclined at an angle of between 10° and 60° to the bottom surface of the pick arm.

7. The pick arm of claim 1, wherein the sloping surface is inclined at an obtuse angle to a top surface of the pick arm.

8. The pick arm of claim 7, wherein the sloping surface is inclined at between 120° and 170° to the top surface of the pick arm.

9. The pick arm of claim 1, wherein:
    the pick and place arm is operable to rotate about a vertical axis proximate the second end of the pick arm; and
    the winged part is closer to the first end than the second end of the pick arm.

10. The pick arm of claim 1, wherein the bottom portion of the winged part is wider than the top portion of the winged part.

11. The pick arm of claim 1, wherein a length of the winged part parallel to the longitudinal axis is between 10% to 100% of a length of the pick arm parallel to the longitudinal axis.

12. The pick arm of claim 1, wherein the at least one sloping surface is formed by a winged part adjoining a side wall of the central segment, and
    the winged part comprises a triangular cross-section perpendicular to the longitudinal axis.

13. A pick and place apparatus for semiconductor devices, the apparatus including:

a pick arm comprising:
- first and second ends along a longitudinal axis of the pick arm;
- a pick tool located at the first end of the pick arm and configured for picking up semiconductor devices located below a bottom surface of the pick arm;
- a central segment separate from the pick tool and extending between the pick tool and the second end of the pick arm; and
- a winged part adjacent the central segment and extending in a direction transverse to the longitudinal axis between the pick tool and the second end of the pick arm,
- wherein the winged part comprises a sloping surface; and
- wherein the sloping surface is inclined between a top portion of the winged part corresponding to a height of a top surface of the central segment and a bottom portion of the winged part corresponding to a height of a bottom surface of the central segment, such that the at least one sloping surface is nearer to the longitudinal axis at the top portion than at the bottom portion of the winged part.

\* \* \* \* \*